(12) United States Patent
Yamada et al.

(10) Patent No.: US 6,407,547 B1
(45) Date of Patent: Jun. 18, 2002

(54) BIAXIAL FLUX GATE TYPE MAGNETIC SENSOR

(75) Inventors: Yasuharu Yamada, Takatuki; Kenichi Yoshimi, Nara, both of (JP)

(73) Assignee: Shimadzu Corporation, Kyoto (JP)

( * ) Notice: Subject to any disclaimer, the term of this patent is extended or adjusted under 35 U.S.C. 154(b) by 0 days.

(21) Appl. No.: 09/386,755

(22) Filed: Aug. 31, 1999

(30) Foreign Application Priority Data

Jun. 27, 1997 (JP) ............................................. 9-172356

(51) Int. Cl.[7] .......................... G01R 33/05; H01F 10/26
(52) U.S. Cl. .......................... 324/253; 33/361; 324/249
(58) Field of Search ................................. 324/253, 249, 324/252, 247, 160, 254, 255; 33/361; 340/870.33

(56) References Cited

U.S. PATENT DOCUMENTS

| 4,262,427 A | * | 4/1981 | Lynch et al. .................. 33/361 |
| 4,967,156 A | * | 10/1990 | Seitz ........................... 324/249 |
| 5,199,178 A | * | 4/1993 | Tong et al. .................... 33/361 |

* cited by examiner

*Primary Examiner*—Walter E. Snow
(74) *Attorney, Agent, or Firm*—Beyer Weaver & Thomas LLP

(57) ABSTRACT

A biaxial flux gate type magnetic sensor has a core which is made of a magnetic thin film in the shape of a loop, patterned upper and lower electrically conductive thin-film layers respectively above and below this core each with an insulating layer in between, and electrically conductive connecting members each extending between and electrically connecting these upper and lower electrically conductive layers. These upper and lower electrically conductive layers are patterned and the contact portions connect them such that they together provide an excitation coil and four detection coils. These coils are each formed so as to be wound helically and uniformly around and along a circumferential direction of the loop-shaped core by passing both inside and outside the loop. The loop is of a shape which is symmetrical with respect to two mutually perpendicular directions and is divided into four mutually symmetric sections. Each of the four detection coils is wound along and around a different one of these four sections. Each of mutually oppositely situated pairs of detection coils on the core is wound in mutually opposite directions and connected to each other.

16 Claims, 5 Drawing Sheets

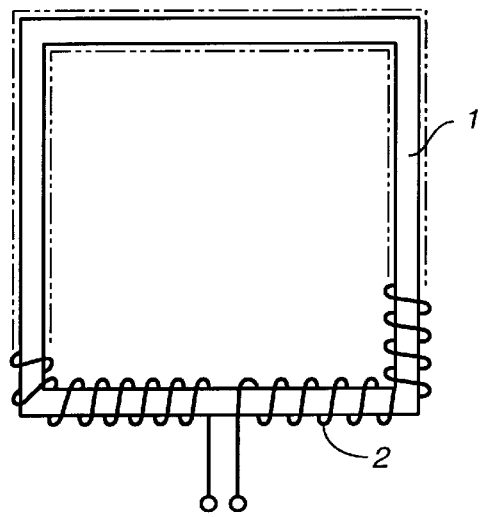
FIG._1A
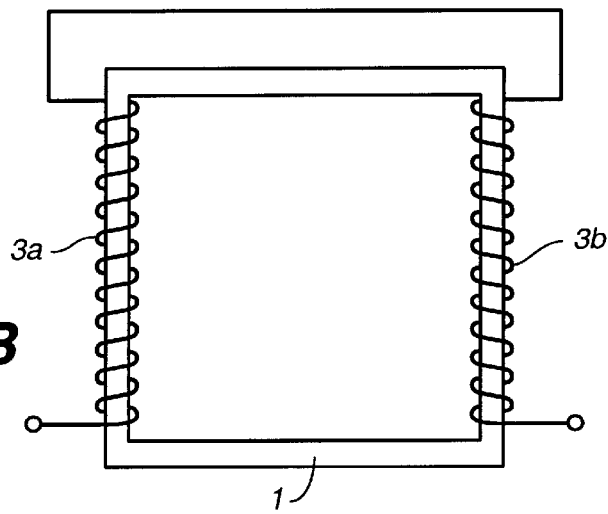
FIG._1B
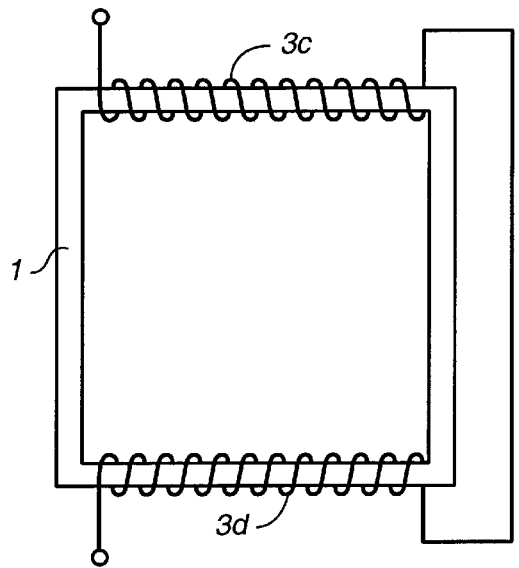
FIG._1C

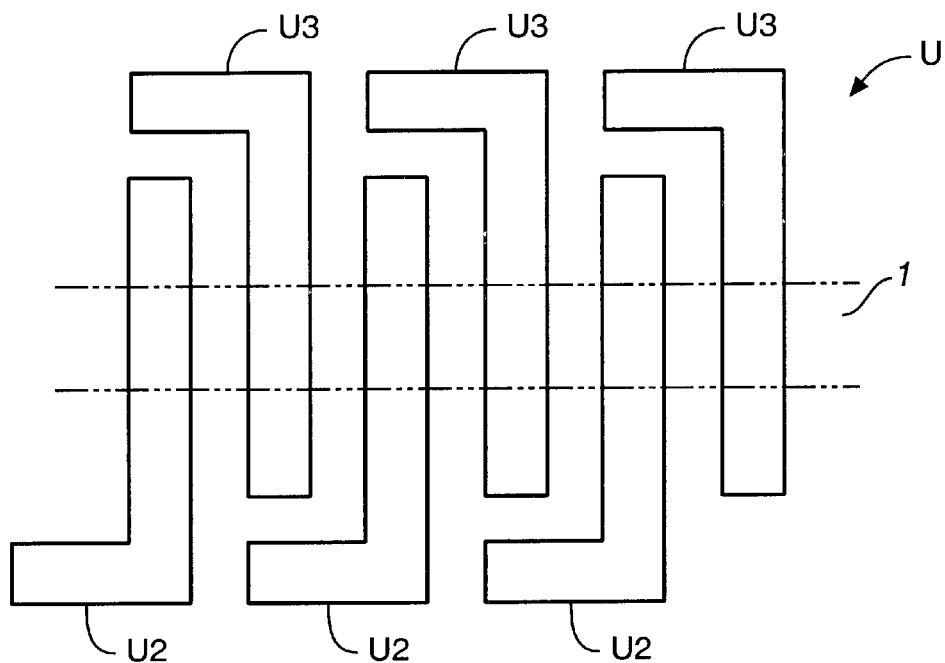
FIG._2A
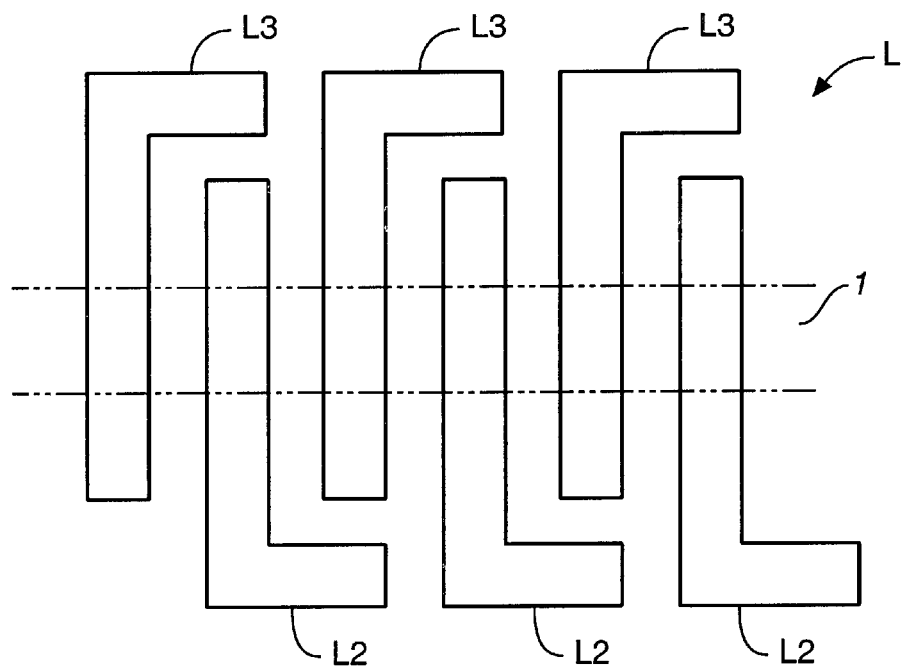
FIG._2B

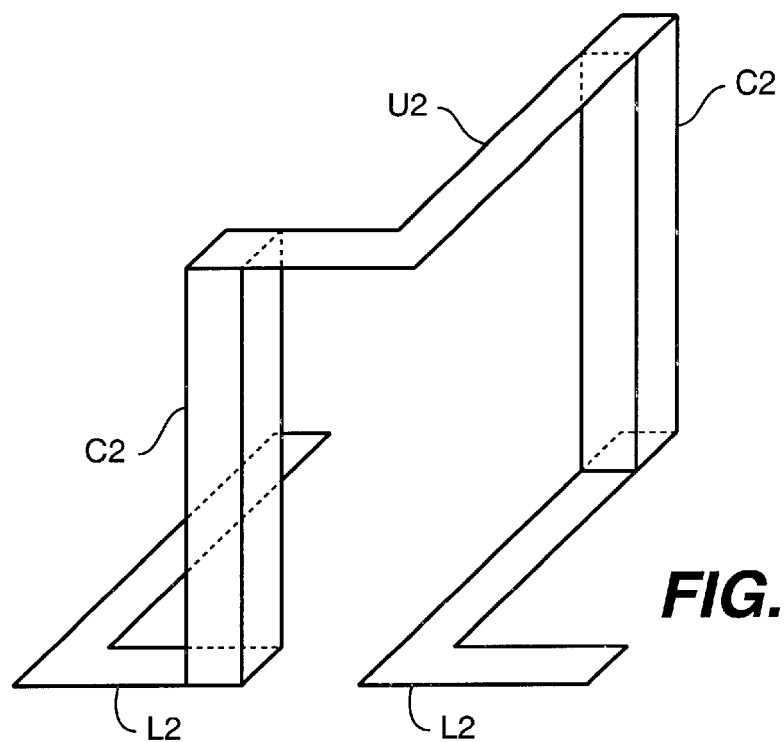
FIG._3A
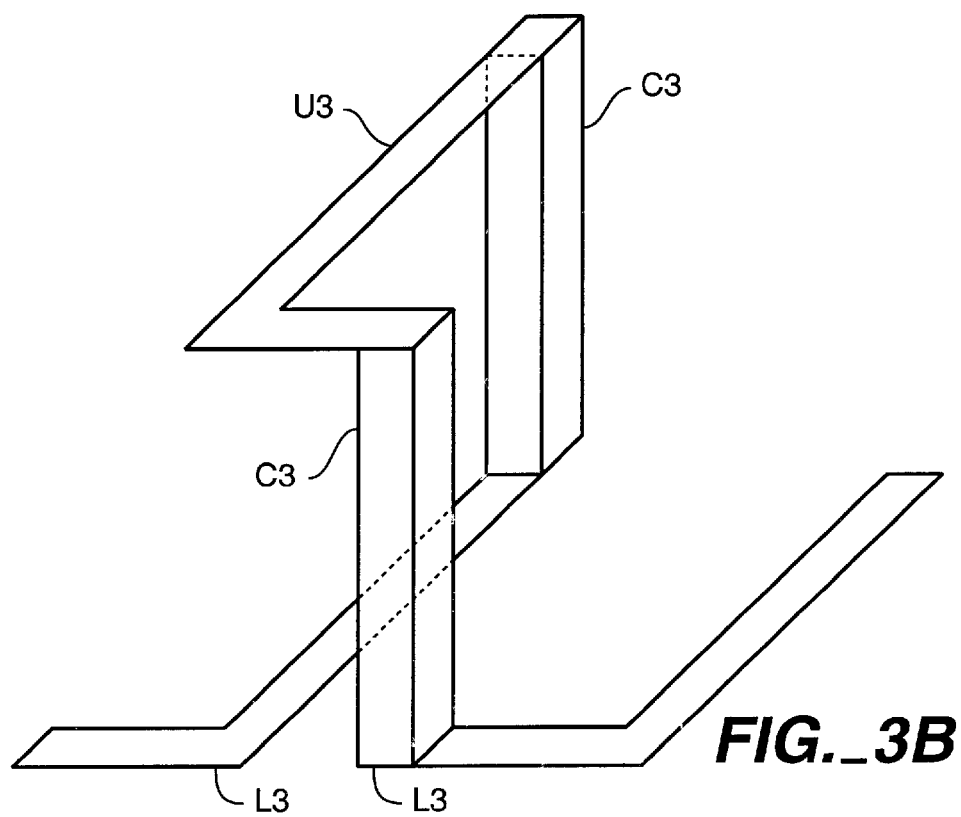
FIG._3B

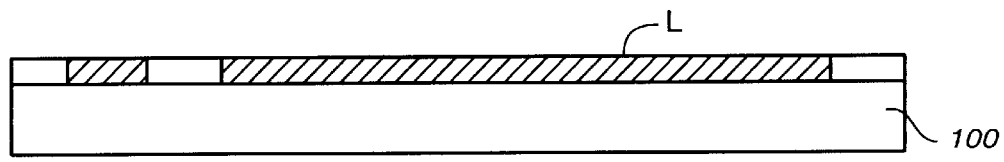
FIG._4A
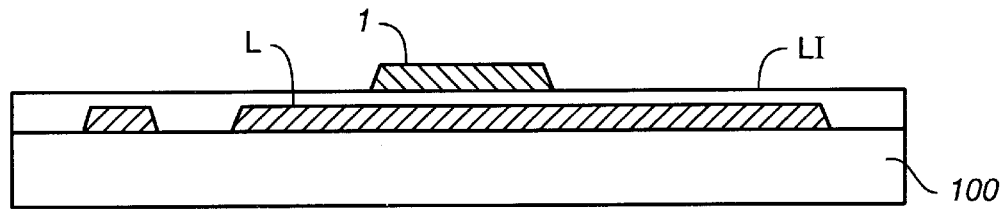
FIG._4B
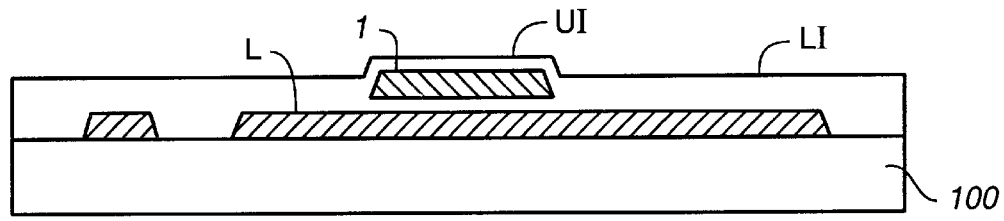
FIG._4C
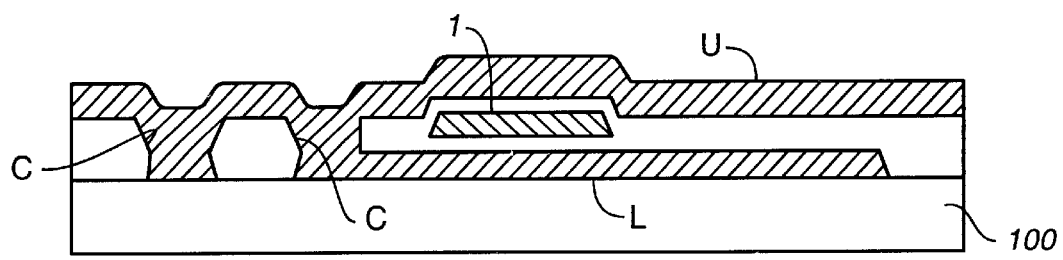
FIG._4D
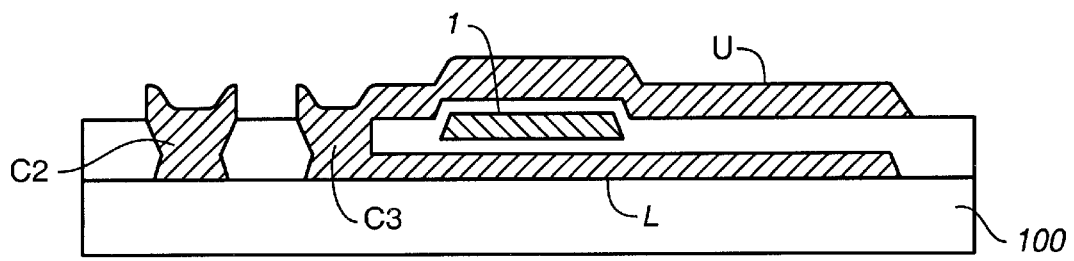
FIG._4E

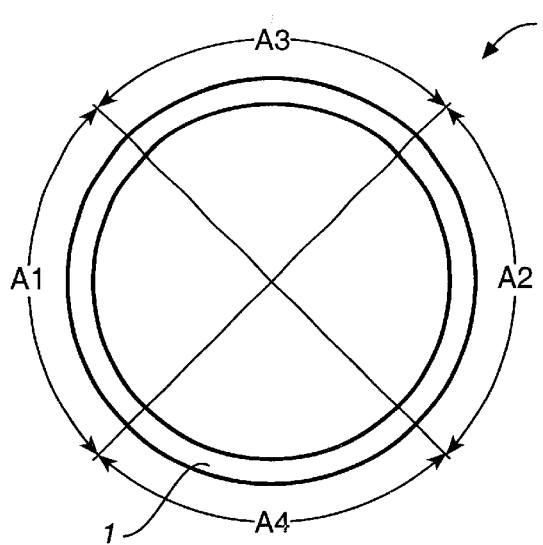
FIG._5
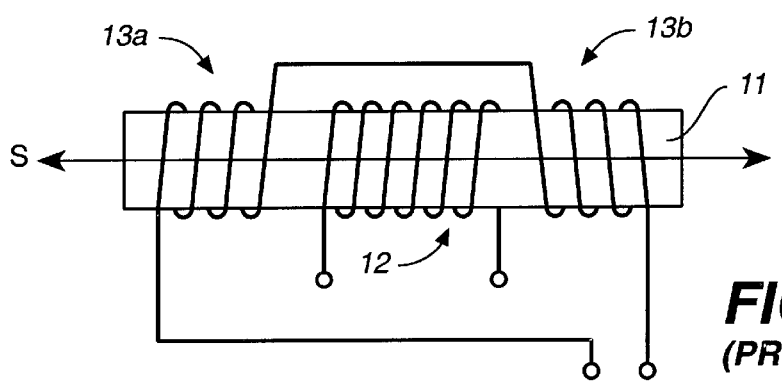
FIG._6
(PRIOR ART)
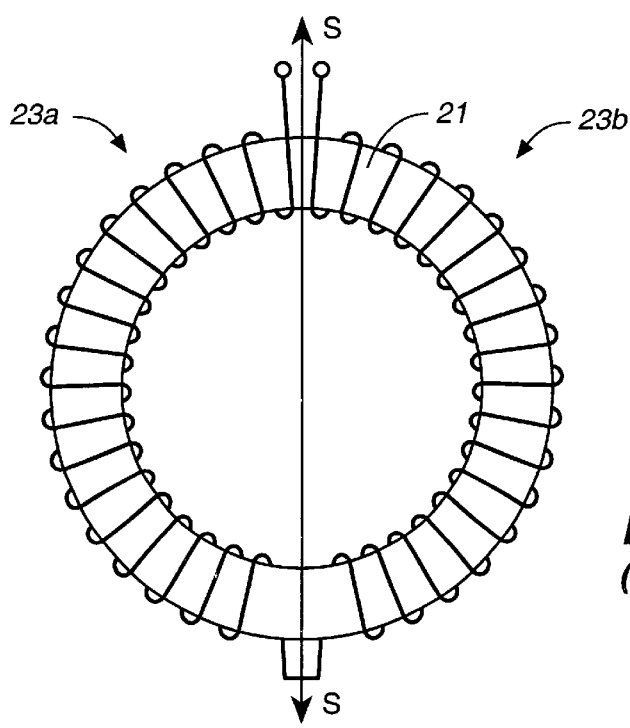
FIG._7
(PRIOR ART)

US 6,407,547 B1

BIAXIAL FLUX GATE TYPE MAGNETIC SENSOR

BACKGROUND OF THE INVENTION

This invention relates to a flux gate type magnetic sensor adapted for the measurement of a very weak magnetic field such as geomagnetism. In particular, this invention relates to a biaxial flux gate type magnetic sensor capable of detecting magnetic fields in two axial directions by means of one thin-film sensor and suited to be used as a direction sensor such as for navigation.

As shown schematically in FIG. 6, a flux gate type magnetic sensor generally includes a core 11 of a magnetic material around which one excitation coil 12 and two detection coils 13a and 13b are wound, the two detection coils 13a and 13b being wound in mutually opposite directions in so-called differential connection, connected at one end of each. As an AC current is caused to flow through the excitation coil 12 as an excitation current, the AC magnetic flux generated thereby along the core 11 penetrates the detection coils 13a and 13b in different directions. If the sensor under this condition is subjected to an external magnetic field, the magnetic flux due to this field acts in the same direction on the two detection coils 13a and 13b, and this means that the magnetic fluxes through them may be interpreted as being biased in mutually opposite directions by this external magnetic field. Thus, it is possible to take out of the ends of the two detection coils an AC voltage signal which is proportional to the external field and has a frequency twice that of the excitation current. If this AC voltage signal is detected, say, after amplified by an AC amplifier and then rectified, it can serve as a magnetic sensor with good sensitivity and stable against temperature variations.

FIG. 6 shows a core 11 in the shape of a bar and the sensor is sometimes referred to as a solenoid type. FIG. 7 shows a sensor of a so-called ring core type, having a core 21 in the shape of a ring. For the sake of simplicity, FIG. 7 does not show the excitation coil for the sensor but it is actually wound uniformly around the entirety of the core 21 so as to spiral alternately with the helix of each of the detector coils 23a and 23b.

In addition to the above, Japanese Patent Publication Tokkai 7-191118 has disclosed a so-called thin-film flux gate type magnetic sensor, as a kind of flux gate type magnetic sensor of the ring core type, having its ring core, excitation coil and detection coils formed with a thin film by the semiconductor production technology such that the sensor element can be miniaturized and the detection characteristics can be improved.

With each of the flux gate type magnetic sensors described above, the flux of the magnetic field to be detected must pass through the detection coil. Thus, each of these sensor has a so-called sensitivity axis (as indicated by arrow S in FIGS. 6 and 7). If a direction sensor, say, for detecting geomagnetism, is desired, therefore, two of these flux gate type magnetic sensors must be set such that their sensitivity axes are perpendicular to each other and that signals are individually taken out of them for detecting magnetism in two axial directions. A method of this kind introduces errors caused by the mechanical positioning of the sensors. The error is even magnified when the direction of the magnetic field is calculated on the basis of the detected signals

SUMMARY OF THE INVENTION

It is therefore an object of this invention to provide a biaxial flux gate type magnetic sensor which is not only capable of detecting magnetism independently in two axial directions by means of a single element so as to be able to serve as a direction sensor having no angular errors but also advantageous from the point of cost, requiring only a small space.

A biaxial flux gate type magnetic sensor embodying this invention, with which the above and other objects can be accomplished, may be characterized not only as having a core comprising a magnetic thin film in the shape of a loop, patterned upper and lower electrically conductive thin-film layers respectively above and below this thin-film core each with an insulating layer in between, and electrically conductive connecting members each extending between and electrically connecting these upper and lower electrically conductive layers but also wherein these upper and lower electrically conductive layers are patterned and the connecting members connect them such that they together provide an excitation coil and four detection coils. These coils are each formed so as to be wound helically, uniformly and alternately after each turn around and along a circumferential direction of the loop-shaped core by passing both inside and outside the loop. The loop is of a shape which is symmetrical with respect to two mutually perpendicular directions and is divided into four mutually symmetric sections and each of the four detection coils is wound along and around a different one of the four sections. Each mutually oppositely situated pair of detection coils on the core is wound in mutually opposite directions and connected to each other.

BRIEF DESCRIPTION OF THE DRAWINGS

The accompanying drawings, which are incorporated in and form a part of this specification, illustrate embodiments of the invention and, together with the description, serve to explain the principles of the invention. In the drawings:

FIGS. 1A, 1B and 1C are views of various coils of a magnetic sensor embodying this invention wound around its loop-shaped core;

FIGS. 2A and 2B show a pattern respectively of the upper wiring layer and the lower wiring layer for the structure of the magnetic sensor embodying this invention;

FIGS. 3A and 3B are a diagonal view respectively of a portion of the excitation coil and a portion of one of the detection coils;

FIGS. 4A, 4B, 4C, 4D and 4E are sectional views of a portion of the magnetic sensor embodying this invention at various stages of its production;

FIG. 5 is a plan view of another loop-shaped core which may be used for the production of a sensor embodying this invention;

FIG. 6 is a schematic drawing showing the structure of a prior art flux gate type magnetic sensor of a so-called solenoid type; and FIG. 7 is a schematic drawing showing the structure of another prior art flux gate type magnetic sensor of a ring core type.

DETAILED DESCRIPTION OF THE INVENTION

The invention is described next by way of an example. FIGS. 1A, 1B and 1C respectively show how an excitation coil 2, a pair of detection coils 3a and 3b for one direction (the "first axial direction") and another pair of detection coils 3c and 3d for a perpendicular direction to the first axial direction (the "second axial direction") are wound around a loop-shaped core 1. Although FIGS. 1A, 1B and 1C show these coils 2, 3a, 3b, 3c and 3d by way of simple lines, it is to be understood that it is merely for the convenience and simplicity of representation and that they are actually each formed with a thin film, as well as the loop-shaped core 1.

The core 1 is made of a magnetic material and has the shape of a square according to this example. As shown in FIG. 1A, the excitation coil 2 is helically and uniformly wound around the core 1 in its circumferential direction passing both outside and inside of the square loop. As shown in FIGS. 1B and 1C, four detection coils 3a, 3b, 3c and 3d are also wound around the core 1, each around a corresponding one of the sides of the square-shaped core 1 and also passing both inside and outside the square loop. The detection coils 3a and 3b are on a mutually opposite pair of sides of the square of the core 1 and the detection coils 3c and 3d are on the other mutually opposite pair of its sides. The detection coils 3a and 3b are wound in mutually opposite directions and are connected to each other. The detection coils 3c and 3d are similarly wound in mutually opposite directions and connected to each other. The detection coils 3a and 3b may together be referred to as a pair of detection coils for the first axial direction, and the detection coils 3c and 3d may together be referred to as another pair of detection coils for the second axial direction (which is perpendicular to the first axial direction). It is to be reminded that the coils 2, 3a, 3b, 3c and 3d are shown as being wound separately around the core 1 in FIGS. 1A, 1B and 1C but they are actually wound together around the single loop-shaped core 1.

As mentioned briefly above, the loop-shaped core 1, the excitation coil 2 and the four detection coils 3a, 3b, 3c and 3d are each formed by superposing thin films on a substrate. Their layered structure and a method of their production will be explained next.

According to an example, an upper wiring layer U having a pattern as shown in part in FIG. 2A and a lower wiring layer L having another pattern as shown in part in FIG. 2B are formed respectively above and below a layer forming the loop-shaped core 1, each through an insulating layer (not shown). Briefly explained, the excitation coil 2 and the four detection coils 3a, 3b, 3c and 3d are formed by connecting these upper and lower wiring layers U and L at specified positions.

Explained more in detail, the upper wiring layer U has pattern portions U2 for forming upper portions of the excitation coil 2 and pattern portions U3 for forming upper portions of the detection coils 3a, 3b, 3c and 3d, and the lower wiring layer L has similarly pattern portions L2 for forming lower portions of the excitation coil 2 and pattern portions L3 for forming lower portions of the detection coils 3a, 3b, 3c and 3d. In other words, as shown in FIGS. 1A, 1B and 1C, the excitation coil 2 is formed overlappingly with the detection coil 3d such that they turn alternately after each turn. The intermediate layer which lies between the upper and lower wiring layers U and L has throughholes penetrating completely therethrough and conductive connecting members C2 are disposed inside these throughholes to connect the upper and lower pattern portions U2 and L2 for forming the excitation coil 2, as shown in part in FIG. 3A such that the excitation coil 2 wound around the loop-shaped core 1 can be formed as a whole. Similarly, the upper and lower pattern portions U3 and L3 for forming the detection coils 3a, 3b, 3c and 3d are connected to each other by conductive connecting members C3 disposed inside other throughholes through the aforementioned intermediate layer as shown in FIG. 3B such that the detection coils 3a, 3b, 3c and 3d wound around the loop-shaped core are formed as a whole.

For the production of the loop-shaped core 1, use may be made of an isotropic film or a film which is made anisotropic such that the magnetic permeability is the same both in the first axial direction and the second axial direction.

FIGS. 4A, 4B, 4C, 4D and 4E show the steps through which the three-dimensional structure of thin films as described above may be obtained. Firstly, a thin film (say, of Cu) of thickness 2 $\mu$m is formed on the surface of a substrate 100 comprising melted quartz by a process such as DC magnetron sputtering. The lower wiring layer L with the pattern portions L2 and L3, as described above, is obtained thereafter by patterning such as a process using both photolithography and ion beam etching. The grooves between the wire patterns are filled, say, with a vapor-deposited $SiO_2$ film, and made flat by a lift-off process, as shown in FIG. 4A. Next, films of $SiO_2$ and permalloy, for example, are sequentially deposited by sputtering, and the permalloy film is patterned by a similar method as described above such that a lower insulating layer L1 and the square-shaped core 1 are obtained, as shown in FIG. 4B.

Next, a $SiO_2$ film is formed thereabove by sputtering to obtain an upper insulating layer U1, as shown in FIG. 4C. After the lower and upper insulating layers L1 and U1 are etched together, say, by an ion-beam etching method, to produce throughholes ("contact holes") C at specified positions, each near the end of a lower pattern portion L2 or L3, a thin film of Cu is formed, as shown in FIG. 4D. Thereafter, this thin film is patterned, say, by photolithography and ion-beam etching, to form not only the upper wiring layer U having the pattern portions U2 and U3, but also electrically conductive connecting members C2 and C3 which are formed inside the contact holes C to electrically connect respectively the upper and lower pattern portions U2 and L2 and the upper and lower pattern portions U3 and L3.

In summary, a loop-shaped core, an excitation coil which is uniformly wound around it helically, and four detection coils which are each wound around one quarter of the circumference of the loop-shaped core similarly, as described in FIGS. 1A, 1B and 1C can be obtained with all these components formed with thin films. Since a technology such as photolithography can be used for the patterning of the coils, furthermore, the perpendicular relationship between the two pairs of mutually oppositely situated detection coils 3a with 3b and 3c with 3d can be extremely accurately achieved.

The loop-shaped core 1 is excited by an AC current through the single excitation coil 2 and the AC magnetic flux thereby generated penetrates the detection coils 3a and 3b for the first axial direction in mutually opposite directions and simultaneously the detection coils 3c and 3d for the second axial direction in mutually opposite directions. If the sensor under this condition is subjected to an external magnetic field, its component in the first axial direction affects the detection coils 3a and 3b in the same direction. Thus, the AC magnetic flux passing through these detection coils 3a and 3b become biased in mutually opposite directions by this component of the external magnetic field in the first axial direction, and an AC voltage signal proportional to the component of this external magnetic field in the first axial direction can be taken out from the ends of these detection coils 3a and 3b. Similarly, since the component of the external magnetic field in the second axial direction affects the detection coils 3c and 3d in the same direction, the AC magnetic flux passing through these detection coils 3c and 3d become biased in mutually opposite directions by this component of the external magnetic field in the second axial direction, and another AC voltage signal proportional to the component of this external magnetic field in the second axial direction can be similarly taken out from the ends of these detection coils 3c and 3d.

In other words, components of a magnetic field in mutually perpendicular axial directions can be detected by using only one sensor element according to this invention and these two axial directions can be extremely accurately set.

Although the invention has been described above with reference to only one example, this example is intended to be demonstrative, not as limiting. Many modifications and variations are possible within the scope of the invention. For example, the loop-shaped core need not be square in shape. It may be of any other shape which is symmetric with reference to two axes, such as a circle. FIG. 5 shows another sensor element with a circular core 1'. The four detector coils will be each wound around a different one of equal portions A1, A2, A3 and A4, each of which is one quarter of the circumference of the circular core 1' and into which the circular core 1' is divided.

Although it was shown above that the excitation coil 2 and each of the detection coils 3a, 3b, 3c and 3d are to be formed in the common upper and lower wiring layers and then connected together, an upper wiring layer and a lower wiring layer for the excitation coil and an upper wiring layer and a lower wiring layer for the detection coils may be formed in different layers.

It is a main merit of this invention that a magnetic sensor with two mutually perpendicular sensitivity axes can be obtained essentially with a single flux gate type magnetic sensor. Moreover, the perpendicular relationship of these two sensitivity axes can be achieved extremely accurately because each of the detection coils is of a thin-film structure and can be patterned by a technology such as photolithography. Thus, the present invention provides an accurate biaxial flux gate type magnetic sensor which can be produced not only compactly but also at a reduced cost.

What is claimed is:

1. A biaxial flux gate magnetic sensor comprising:
   a thin-film core shaped as a loop and made of a magnetic material;
   patterned upper and lower electrically conductive thin-film layers respectively above and below said core each with an insulating layer in between; and
   electrically conductive connecting members, each of said connecting members extending between and electrically connecting said upper and lower electrically conductive layers;
   said upper and lower electrically conductive layers being patterned and said connecting members connecting said upper and lower electrically conductive layers so as to together provide overlappingly an excitation coil and four detection coils; said excitation coil and said detection coils each being wound helically, uniformly and alternately after each turn around and along a circumferential direction of said core by passing both inside and outside said loop; said core being divided into four equal sections around said loop; said four detection coils being each wound along and around a different one of said sections; each pair of said detection coils which are opposite to each other on said core being wound in mutually opposite directions and being connected to each other.

2. The magnetic sensor of claim 1 wherein said loop has a shape which is symmetric with respect to two different directions.

3. The magnetic sensor of claim 2 wherein said two different directions are perpendicular to each other.

4. The magnetic sensor of claim 3 wherein said loop is circular.

5. The magnetic sensor of claim 3 wherein said loop is a square.

6. The magnetic sensor of claim 1 wherein said upper and lower electrically conductive layers comprise permalloy.

7. The magnetic sensor of claim 1 wherein said core comprises melted quartz.

8. The magnetic sensor of claim 1 wherein said insulating layer comprises $SiO_2$.

9. A biaxial flux gate magnetic sensor comprising:
   a thi-film core shaped as a loop and made of a magnetic material;
   patterned upper and lower electrically conductive thin-film layers respectively above and below said core each with an insulating layer in between; and
   electrically conductive connecting members, each of said connecting members extending between and electrically connecting said upper and lower electrically conductive layers;
   said upper and lower electrically conductive layers being patterned and said connecting members connecting said upper and lower electrically conductive layer so as to together provide an excitation coil and four detection coils; said excitation coil and said detection coils each being wound helically, uniformly and alternately after each turn around and along a circumferential direction of said core by passing both inside and outside said loop; said core being divided into four equal sections around said loop; said four detection coils being each wound along and around a different one of said sections; each pair of said detection coils which are opposite to each other on said core being wound in mutually opposite directions and being connected to each other;
   wherein said insulating layer has throughholes and said conductive connecting members are each inside a corresponding one of said throughholes.

10. The magnetic sensor of claim 9 wherein said loop has a shape which is symmetric with respect to two different directions.

11. The magnetic sensor of claim 10 wherein said two different directions are perpendicular to each other.

12. The magnetic sensor of claim 11 wherein said loop is circular.

13. The magnetic sensor of claim 11 wherein said loop is a square.

14. The magnetic sensor of claim 9 wherein said upper and lower electrically conductive layers comprise permalloy.

15. The magnetic sensor of claim 9 wherein said core comprises melted quartz.

16. The magnetic sensor of claim 9 wherein said insulating layer comprises $SiO_2$.

* * * * *